(12) United States Patent
Holley et al.

(10) Patent No.: US 8,891,218 B2
(45) Date of Patent: Nov. 18, 2014

(54) FAULT TOLERANT FAIL-SAFE LINK

(71) Applicant: The Boeing Company, Chicago, IL (US)

(72) Inventors: Robert Dennis Holley, Seattle, WA (US); N. Evan Lurton, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 19 days.

(21) Appl. No.: 13/650,285

(22) Filed: Oct. 12, 2012

(65) Prior Publication Data

US 2014/0103990 A1   Apr. 17, 2014

(51) Int. Cl.
H02H 3/00 (2006.01)

(52) U.S. Cl.
USPC .......................................................... 361/86

(58) Field of Classification Search
USPC .......................................................... 361/86
See application file for complete search history.

(56) References Cited

U.S. PATENT DOCUMENTS

| | | |
|---|---|---|
| 4,009,420 A | 2/1977 | Martinez-Depison |
| 4,110,809 A | 8/1978 | Cronin |
| 4,174,496 A | 11/1979 | Anderson et al. |
| 4,336,568 A | 6/1982 | Mitchell |
| 4,626,954 A | 12/1986 | Damiano et al. |
| 4,656,365 A | 4/1987 | Billings |
| 4,665,355 A | 5/1987 | McCollum et al. |
| 4,713,601 A | 12/1987 | Zahm et al. |
| 4,724,374 A | 2/1988 | Beg |
| 4,740,883 A | 4/1988 | McCollum |
| 4,864,214 A | 9/1989 | Billings et al. |
| 5,126,911 A * | 6/1992 | Contiero et al. ................ 361/84 |
| 5,444,590 A | 8/1995 | Lecomte et al. |
| 5,497,072 A | 3/1996 | Lecomte et al. |
| 5,723,915 A | 3/1998 | Maher et al. |
| 5,752,047 A | 5/1998 | Darty et al. |
| 6,108,182 A * | 8/2000 | Pullen ............................. 361/89 |
| 6,125,024 A | 9/2000 | Lecomte et al. |
| 6,768,350 B1 | 7/2004 | Dickey |
| 7,064,448 B2 | 6/2006 | Maier |
| 7,193,337 B2 | 3/2007 | Nguyen et al. |
| 7,505,820 B2 | 3/2009 | Plivcic et al. |
| 7,626,797 B2 | 12/2009 | Kilroy et al. |
| 7,741,883 B2 | 6/2010 | Fuller et al. |
| 8,035,066 B2 | 10/2011 | Abe et al. |
| 8,148,848 B2 | 4/2012 | Rusan et al. |
| 8,363,370 B2 * | 1/2013 | Shiner et al. ................ 361/91.1 |
| 2006/0255746 A1* | 11/2006 | Kumar et al. ............ 315/209 R |

* cited by examiner

*Primary Examiner* — Dharti Patel
(74) *Attorney, Agent, or Firm* — Hope Baldauff LLC

(57) ABSTRACT

The present disclosure is generally directed to a plurality of solid state switches of varying periphery sizes connected in series between a power source and a load. A built-in test circuit senses an overvoltage condition across one or more of the varying periphery sizes and opens or closes the one or more of the varying periphery sizes in accordance with a measured voltage across at least one solid state switch of the plurality of solid state switches.

20 Claims, 4 Drawing Sheets

FAULT TOLERANT FAIL-SAFE LINK

TECHNICAL FIELD

The field of the embodiments presented herein is directed toward a solid state power controller designed to operate in a failsafe or fault tolerant state.

BACKGROUND

The fusible link circuit breaker was developed in the early eighties to obtain wire separation relief on vehicle electronics systems. The original intent was to prevent propagation of wire damage to adjacent wires if a circuit breaker was to malfunction in a closed position and fail to open on a fault. A failure mode in older circuit breakers with silver cadmium or silver tungsten contacts was to weld together or be jammed from opening on a heavy fault current. Additionally, in a solid state power controller (SSPC), these failsafe fuses can only serve one thermal rating that causes wire integration issues by limiting the choice as to which connector or pin a load wire will come from.

In order to gain the most wire weight savings from the application of Solid State Power Controller (SSPC) technology, a new approach to failsafe design must be devised that does not depend on a physical fusing device. Current solutions use fuses as failsafe protection for a shorted Field Effect Transistor (FET) condition. Some SSPCs do not have backup protection (the Secondary Power Distribution Assembly (SPDA) on the MMA (Multi Mission Airplane)). There exists a need to allow a circuit to keep functioning even though there may be a shorted FET, where a Built-In-Tester (BIT) will report the shorted FET failure to a maintenance computer upon the next power up. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a fail-safe link including a plurality of solid state switches of varying periphery sizes, e.g., gate, drain, and/or source periphery dimensionality of the solid state switches, e.g., 5 um gate periphery, 1 mm gate periphery, 100 mm gate periphery, 10,000 mm gate periphery, . . . , of the solid state switches, including field effect transistors (FETS), that are related to current or voltage handling capability, connected in series between a power source and a load, and a built-in test circuit that senses an overvoltage condition across one or more of the varying periphery sizes and opens or closes the one or more of the varying periphery sizes in accordance with a measured voltage across at least one solid state switch of the plurality of solid state switches.

In another embodiment disclosed herein, a fail-safe link includes a plurality of branches connected in parallel between a power source and a load, where each of the plurality of branches contain a plurality of solid state switches of varying periphery sizes, e.g., gate, drain, or source periphery dimensionality, e.g., 5 um gate periphery, 1 mm gate periphery, 100 mm gate periphery, 10,000 mm gate periphery, . . . , of the solid state switches, including field effect transistors (FETS), that are related to current or voltage handling capability, connected in series between the power source and the load, and a built-in test circuit that senses an overvoltage condition across one or more of the varying periphery sizes and opens or closes the one or more of the varying periphery sizes in accordance with a measured voltage across at least one solid state switch of the plurality of solid state switches.

In another embodiment disclosed herein, a method of operating a fail-safe link includes providing a plurality of solid state switches of varying periphery sizes, e.g., gate, drain, or source dimensionality, e.g., 5 um gate periphery, 1 mm gate periphery, 100 mm gate periphery, 10,000 mm gate periphery, . . . , of the solid state switches, including field effect transistors (FETS), that are related to current or voltage handling capability, connected in series between a power source and a load, and providing a built-in test circuit that senses an overvoltage condition across one or more of the varying periphery sizes and opens or closes the one or more of the varying periphery sizes in accordance with a measured voltage across at least one solid state switch of the plurality of solid state switches. A first one of the plurality of solid state switches is opened when a second one of the plurality of solid state switches fails in a closed state. Thereafter, a signal is sent to each gate of the plurality of solid state switches to be in an open state, and a load is applied to the solid state power controller by a built-in test circuit. The method then senses if a voltage is present across at least one of the plurality of solid state switches to confirm that at least one of the plurality of solid state switches has failed in a closed state. For example, one or more of the fail-safe link(s) described may be utilized for a mobile vehicle application to provide variable thermal protection switchability for protection of one or more components, e.g., low noise amplifiers, high gain amplifiers, receivers, transceivers, antennas, power amplifiers, and the like as well as integrated electronics modules containing one or more components.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

DETAILED DESCRIPTION

Figure 1:
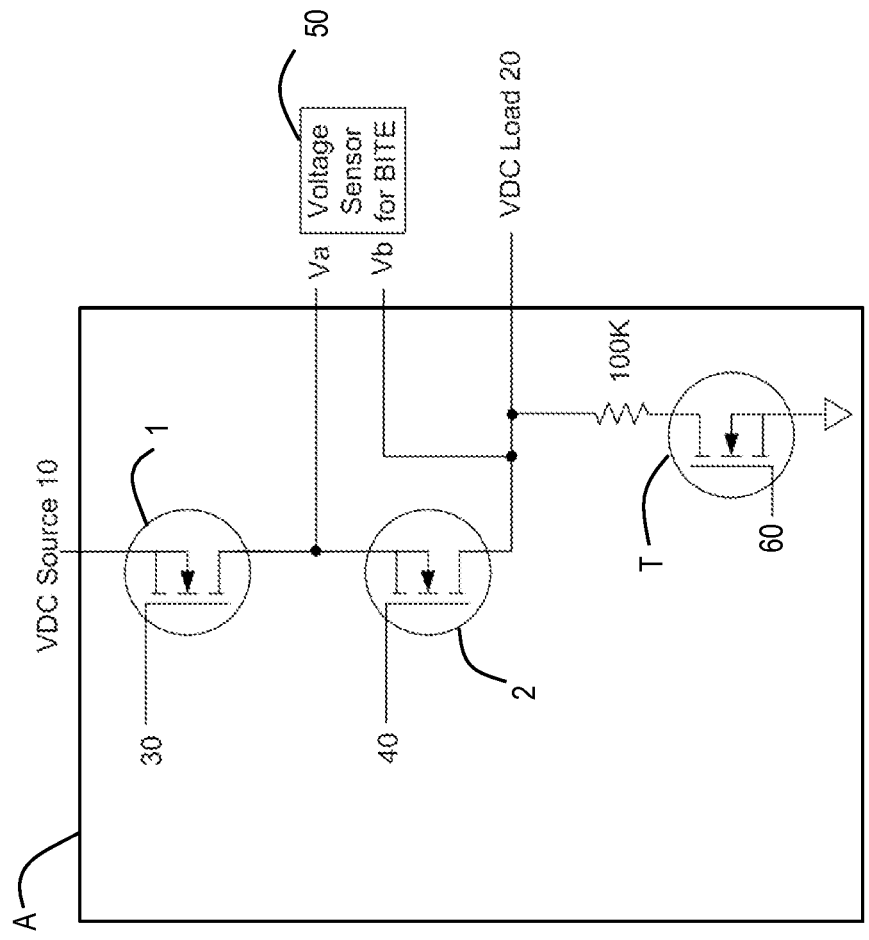
FIG. 1 illustrates a schematic diagram of one embodiment of a fail-safe link disclosed herein.

Fail-safe links including solid state power controllers (SSPC) are semiconductor devices that control power (voltage and/or current) being supplied to a load. They perform supervisory and diagnostic functions in order to identify overload conditions and prevent short circuits. There are several basic types of SSPC, namely: AC controllers designed to switch alternating current (AC) voltages; DC controllers designed to switch direct current (DC) voltages; and AC/DC controllers designed to switch both AC and DC voltages. Analog controllers use variable voltage, current, or some other method of analog control. Microcontrollers require programming from external devices and are complete computer systems on a chip that typically combine an arithmetic logic unit (ALU), memory, timer/counters, serial port, input/output (I/O) ports, and a clock oscillator. SSPCs can be programmed by a computer, or by a specialized or proprietary programming method.

Specifications for SSPC include dropout voltage, input voltage, load voltage, and maximum load current. Dropout voltage (must-release voltage, turn-off voltage) is the voltage applied to the input at or below which the output enters the OFF state. Input voltage (must operate voltage, pickup voltage, turn-on voltage) is the range of voltages which, when applied across the input terminals, maintains the ON condition across the output terminal. Load voltage (maximum switching voltage, line voltage) is the range of output supply voltages over which the SSPC normally operates. Maximum load current (maximum switching voltage range, maximum switching current) is the maximum continuous current allowed across SSPC output terminals under specified heat dissipation and ambient-temperature conditions. Other specifications for solid state power controllers (SSPC) include the number of input channels and the input current range.

With the advance of new wide band gap semiconductors, programmability of SSPCs is now possible. Each SSPC can be programmed for different thermal ratings. As a result, the SSPC is programmed to the load on the pin that the wire designer designates to overcome wire integration problems.

Regarding failsafe protection designs in SSPC technology, the two failure modes of an SSPC that require failsafe protection are: 1) the failure of the control circuitry to remove power from the gate of the FET, and 2) the failure of the FET itself in a shorted condition.

In the field of avionic electrical systems, a FET gate signal has a failure rate of $5.28 \times 10^{-15}$ per hour and the FET failure rate of $3.08 \times 10^{-8}$ per hour. The probability of a hard fault on an avionic electrical wire is $2.0 \times 10^{-7}$ per hour. Therefore, the probability of both events concurrently occurring is $6.16 \times 10^{-15}$ per hour for a failed FET with a fault, and $1.056 \times 10^{-21}$ per hour for a failed gate control signal circuit with a fault.

In some cases, a shorted FET may have a high enough resistance to the wire until the bond wires in the SSPC fuse open. However, there is no guarantee that this occurrence will always take place. Sizing bond wires to the thermal rating of the SSPC limits the programmability of the devices and adds cost and complexity. Any physical fusing device will limit the advantage of programmability or wire weight reduction.

Higher load ratings use multiple FETs in parallel to carry the current. If one FET shorts and the device receives an off (or open) command, all of the current of the load will be carried through the failed FET. With no fault, the load may draw current for some time through the shorted FET before burning through the bond wire. When commanded on (or close), the remaining FETs will carry more load and will decrease the Mean Time Before (MTBF) of the circuit. In this case, a Built-In Test Equipment (BITE) circuitry needs to report the failure of the FET so the circuit can be replaced at the next opportunity. If a fault occurs and a FET has failed, the burn through will be faster but is too unreliable to be counted on for failsafe operation. Lower current loads on a programmable SSPC could draw current for some time before the bond wire fuses, if ever. Another failure mode that must be considered with SSPC technology is a shorted FET that cannot be commanded off (or opened). If certain loads are commanded off, and continue to run, they may pose a safety threat. The embodiments presented herein allow the circuit to keep functioning even though there may be a shorted FET. The BITE will report the shorted FET upon the next power up.

One of the embodiments present herein arranges solid state switches in series to form a power "AND" gate. If one FET fails closed, the second FET can open the circuit and clear a fault. This design also embodies a BITE circuit since failures must be detected so maintenance can be performed.

Additionally, with wide band gap semiconductors, programmability is now possible. Each SSPC can be programmed for several thermal ratings. The fault tolerant design eliminates the need for failsafe fuses which can only serve one thermal rating.

The two designs shown below are based on EPC™ GaN MOSFET (part number EPC2015), although any other MOSFET or solid state switch may be used. For example, each EPC FET can withstand 33 A at 150° C. By putting two FETs in series, the circuit handles twice the voltage but doubles the on resistance, (see FIG. 1). By adding a second series of FETs in parallel, (see FIG. 2), the same on resistance is achieved as a single part in FIG. 1, but now twice the load is able to be carried. De-rating the second series of FETs to 50 A provides a safety margin, where this configuration may be programmable from 2.5 amps to 50 amps. This concept may carry as many parallel FETs as required for current requirements or for overload capability.

A two FET solution in parallel would be possible as the Rds (Resistance between the Drain and the Source) for this FET is about 4 milliohms. Two FETs in series will be able to be programmed up to 25 A with an Rds of 8 milliohms.

FIG. 1 illustrates a fault tolerant solid state power controller A with two solid state switch (or FET) design where two solid state switches, solid state switch 1 and solid state switch 2 are used in series between the VDC Source 10 and the VDC Load 20. When solid state switch 1 fails short, or closed, solid state switch 2 will block current flow when off, or open. When solid state switch 2 fails short, solid state switch 1 may still block current flow.

The Built-In-Tester Equipment (BITE) circuit 50 detects whether either solid state switch 1 or solid state switch 2 has failed by first activating a test gate 60 (e.g., a FET) on a small test solid state switch T to apply a small load to the Solid State Power Controller A. With all other primary state gate drives 30 and 40 in an off state, or in an open state, a voltage is applied to the input 10 and is measured at voltage sense line Va. If voltage is present, solid state switch 2 may be shorted. With solid state switch 1 on, or in a closed state, and solid state switches 2 off, or in an open state, a voltage is sensed at line Vb. If a voltage is present, solid state switch 1 may be shorted.

Figure 2:
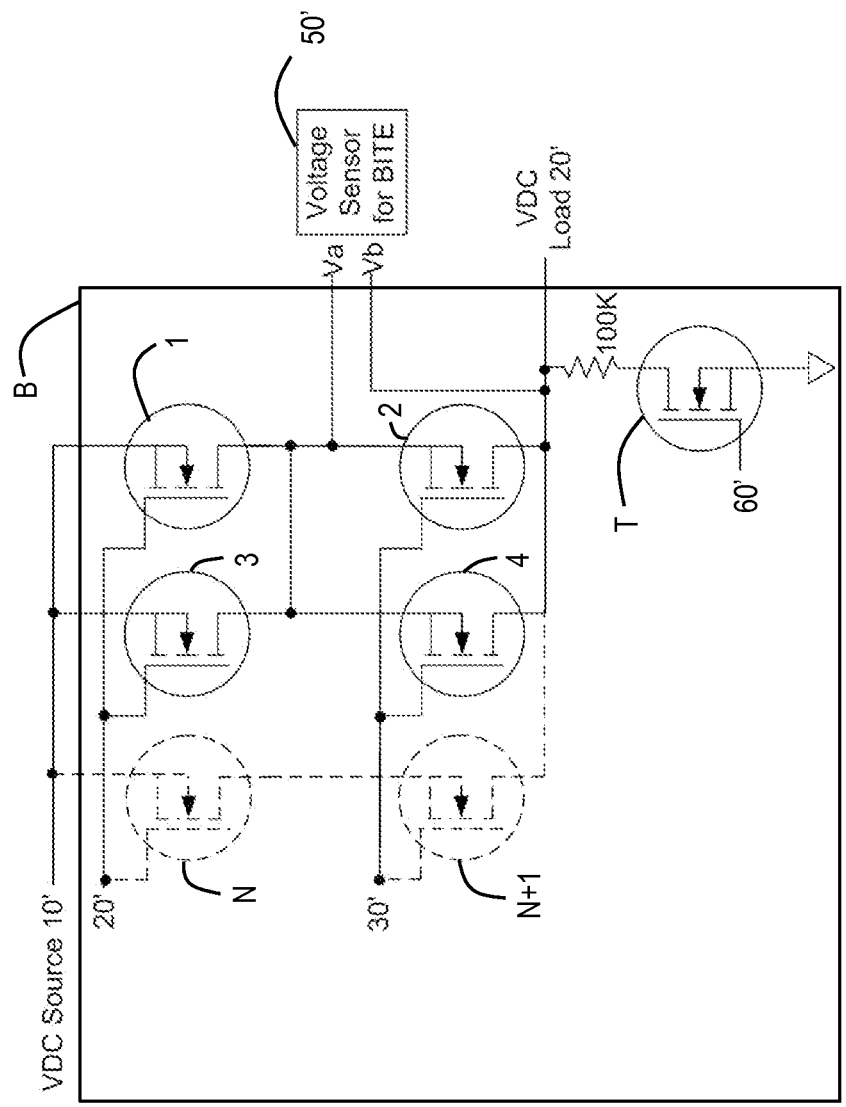
FIG. 2 illustrates a schematic diagram of another embodiment of a fail-safe link disclosed herein.

FIG. 2 illustrates a fault tolerant Solid State Power Controller B having a four solid state switch (or FET) design in a similar configuration to the two solid state switch design of SSPC A of FIG. 1, except that each series of two solid state switches are used in a parallel configuration. If solid state switch 1 or solid state switch 3 (similar to switches 1 and 3 in FIG. 1), fails short, solid state switch 2 and solid state switch 4 will block the power when off. If solid state switch 2 or solid state switch 4 fails short, solid state switch 1 and solid state switch 3 can still block current flow. FIG. 2 also illustrates that multiple branches of solid state switches in series, e.g., solid state switch N and solid state switch N+1, may be added in parallel between the VDC Source 10' and the VDC Load 20'.

The Built-In-Tester Equipment (BITE) circuit 50' detects whether either solid state switches 1-4 have failed by first activating a test gate 60' on a test solid state switch T to apply a small load to the Solid State Power Controller B. With all other primary stage gate drives 20' and 30' off, i.e., open, and a voltage applied to the input, the voltage is sensed at sense line Va. If voltage is present, either solid state switch 2 or solid state switch 4 is shorted. With solid state switch 1 and solid state switch 3 on, or closed, and solid state switch 2 and solid state switch 4 off, or open, a voltage is sensed at sense line Vb. If voltage is present on Vb, one of the solid state switches is shorted. If the test shows that the SSPC B has a failed solid state switch, it can be locked out until repaired. If not on the Minimum Equipment List (MEL, the minimum equipment that must be functioning for dispatch on a revenue flight), a non-essential load may not delay dispatch. Thus, the controller circuit is allowed to keep functioning even though there may be a shorted solid state switch, wherein a BITE will report the shorted solid state switch failure condition to a maintenance computer or system (not shown) upon the next power up.

Figure 3B:
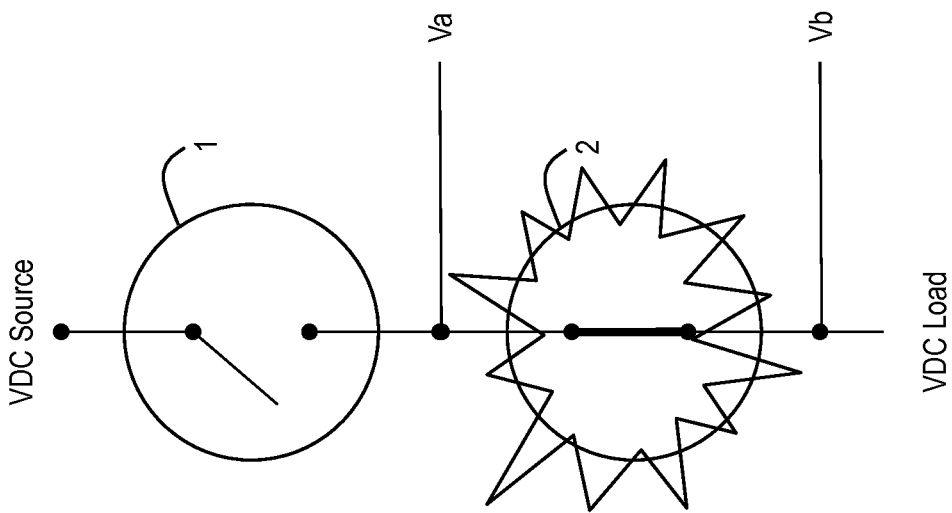
FIG. 3B illustrates a schematic diagram of a second solid state switch configured to remain in an open position when a first solid state switch fails in a closed position.
Figure 3A:
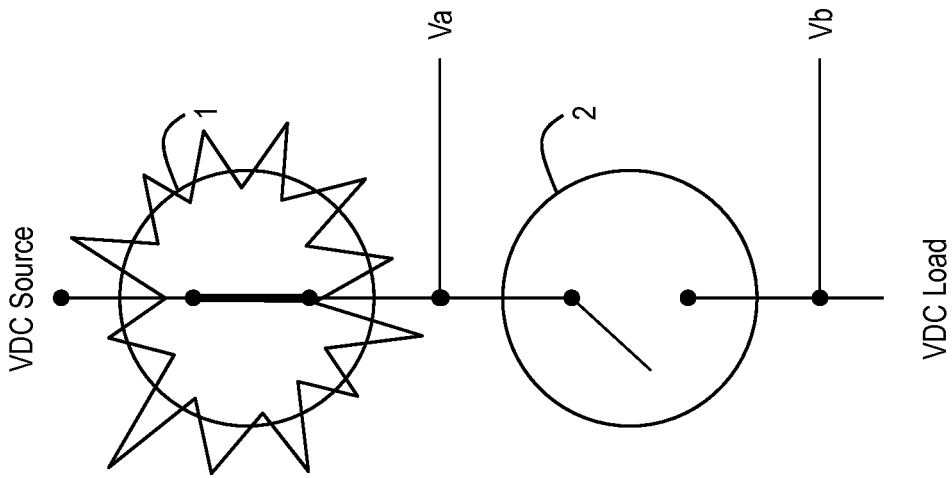
FIG. 3A illustrates a schematic diagram of a first solid state switch configured to remain in an open position when a second solid state switch fails in a closed position.

In summary, the built-in test circuit 50/50' includes a voltage sensor between a load and at least one solid state switch. FIGS. 3A and 3B illustrates a schematic diagram of a series of solid states switches 1, 2, where one switch fails in a closed position. FIG. 3A illustrates a first solid state switch 1 of the plurality of solid state switches being configured to remain in an open position when a second solid state switch 2 of the plurality of solid state switches fails in a closed position. FIG. 3B illustrates a second solid state switch 2 of the plurality of solid state switches being configured to remain in an open position when a first solid state switch 1 of the plurality of solid state switches fails in a closed position. The first solid state switch 1 may be configured at its gate 20/20' (see FIGS. 1-2) to be in an on or closed configuration, and the second solid state switch 2 may be configured at its gate 30/30' (see FIGS. 1-2) to be in an off or open configuration. The built-in test circuit further includes a solid state switch T that supplies a load to the solid state power controller A/B, and a voltage sensor Va/Vb at 50/50' between a load and at least one solid state switch.

Figure 4:
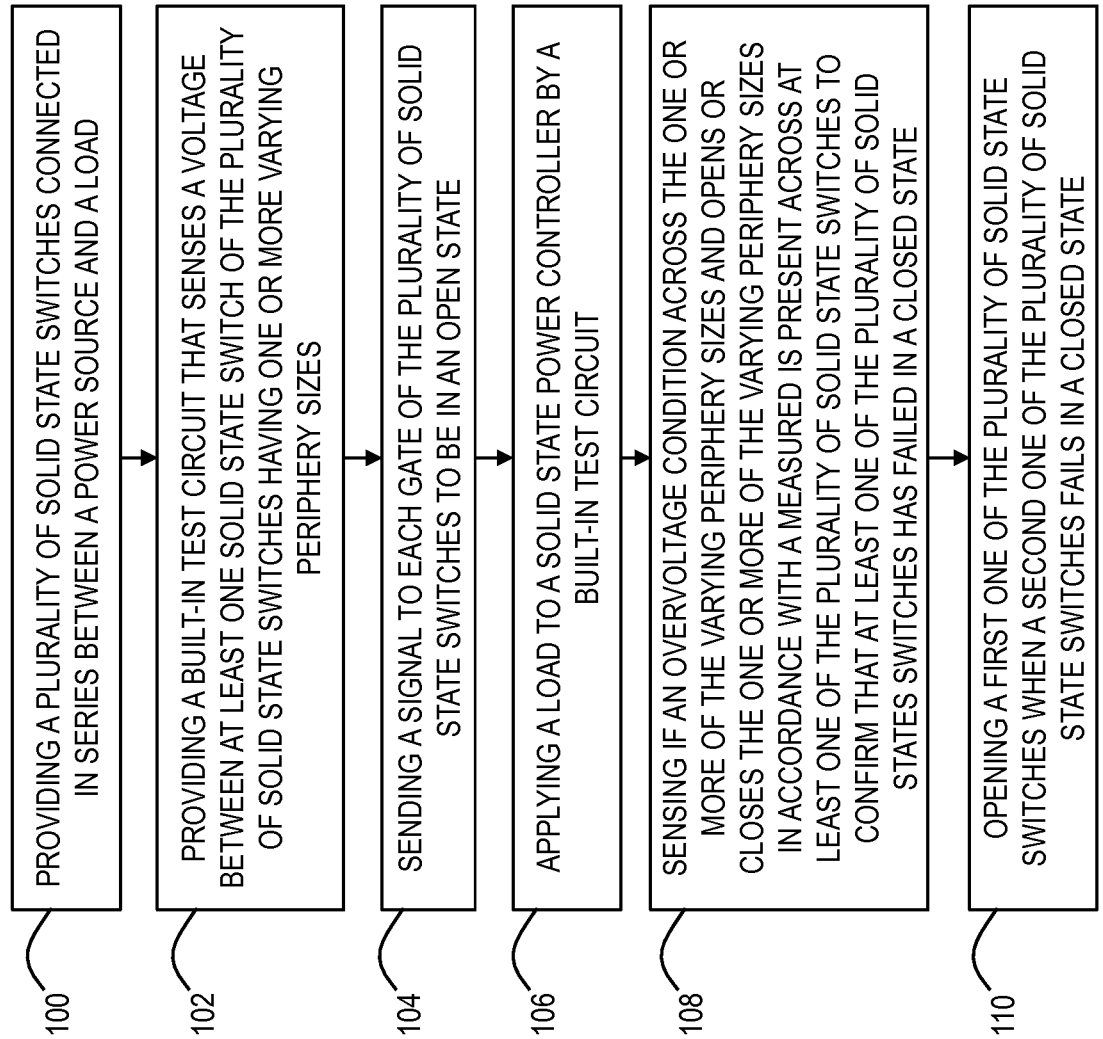
FIG. 4 illustrates a method of one embodiment for operating a fail-safe link.

FIG. 4 illustrates a method of one embodiment for operating a solid state power controller where a plurality of solid state switches are provided 100 connected in series between a power source and a load, and a built-in test circuit is provided 102 that senses a voltage between at least one solid state switch of the plurality of solid state switches having one or more varying periphery sizes. A signal is sent 104 to each gate of the plurality of solid state switches to be in an open state. Thereafter, a load is applied 106 to the solid state power controller by a built-in test circuit. The method then senses 108 if an overvoltage condition across the one or more of the varying periphery sizes and opens or closes the one or more of the varying periphery sizes in accordance with a measured voltage across at least one of the plurality of solid state switches to confirm that at least one of the plurality of solid states switches has failed in a closed state. Finally, a first one of the plurality of solid state switches is opened 110 when a second one of the plurality of solid state switches fails in a closed state.

Advantageously, a fail-safe link is disclosed including solid state switches of varying periphery sizes, e.g., gate, drain, and/or source periphery dimensionality of the solid state switches, e.g., 5 µm gate periphery, 1 mm gate periphery, 100 mm gate periphery, 10,000 mm gate periphery. These various periphery size FETS, e.g., FETS disclosed in FIGS. 1 and 2, when connected in series between a power source and a load, provide improved current or voltage handling capability. The fail-safe link uses a built-in test circuit that senses an overvoltage condition across one or more of the varying periphery sizes and opens or closes the one or more of the varying periphery sizes in accordance with a measured voltage across at least one solid state switch of the plurality of solid state switches.

Advantageously, by switching in and out one or more of the varying periphery FETS, the fail-safe link provides a tunable, variable, and selectable thermal protection circuit, for example, that detects, for example, over voltage and over current conditions, for instance, on a mobile platform or vehicle, e.g., aircraft, so as to prevent shortening an expected usable life of a component, unlike a single, one current rating, thermal circuit breaker or the like, e.g., a 5 amp rated fuse.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. A fail-safe link comprising:
    a plurality of solid state switches of varying periphery sizes connected in series between a power source and a load; and
    a built-in test circuit that senses an overvoltage condition across a first solid state switch of the plurality of solid state switches of varying periphery sizes and one of opens or closes a second solid state switch of the plurality of solid state switches of varying periphery sizes in accordance with a measured voltage across the first solid state switch of the plurality of solid state switches.

2. The fail-safe link according to claim 1, wherein the plurality of solid state switches comprises Field Effect Transistors (FETs).

3. The fail-safe link according to claim 1, wherein the built-in test circuit applies a load to a test gate of a test solid state switch to apply a load to one of the plurality of solid state switches.

4. The fail-safe link according to claim 1, wherein the built-in test circuit includes a voltage sensor between a load and at least one solid state switch.

5. The fail-safe link according to claim 1, wherein a first solid state switch of the plurality of solid state switches is configured to remain in an open position when a second solid state switch of the plurality of solid state switches fails in a closed position.

6. The fail-safe link according to claim 5, wherein the first and second solid state switches are configured at their gates to be in an off or open configuration.

7. The fail-safe link according to claim 6, where the built-in test circuit is configured to supply a load to a solid state power controller and determine if a voltage is present across the failed second solid state switch.

8. The fail-safe link according to claim 5, wherein a second solid state switch of the plurality of solid state switches is configured to remain in an open position when a first solid state switch of the plurality of solid state switches fails in a closed position.

9. The fail-safe link according to claim 8, wherein the first solid state switch being configured at its gate to be in an on or closed configuration, and the second solid state switch being configured at its gate to be in an off or open configuration.

10. The fail-safe link according to claim 9, where the built-in test circuit is configured to supply a load to a solid state power controller and determine a voltage is present across the failed second solid state switch.

11. A fail-safe link for a mobile vehicle to provide variable thermal protection switchability for protection of one or more components on the mobile vehicle, the fail-safe link comprising:
- a plurality of branches connected in parallel between a power source and a load, where each of the plurality of branches contain a plurality of solid state switches having varying periphery sizes connected in series between the power source and the load; and
- a built-in test circuit that senses an overvoltage condition across a first solid state switch of the plurality of solid state switches of varying periphery sizes and one of opens or closes a second solid state switch of the plurality of solid state switches of varying periphery sizes in accordance with a measured voltage across the first solid state switch of the plurality of solid state switches.

12. The fail-safe link according to claim 11, wherein the plurality of solid state switches comprises a plurality of Field Effect Transistors (FETs).

13. The fail-safe link according to claim 11, wherein the built-in test circuit comprises:
- a Field Effect Transistor (FET) that supplies a load to a solid state power controller; and
- a voltage sensor between a load and at least one solid state switch.

14. The fail-safe link according to claim 11, wherein a first solid state switch of the plurality of solid state switches is configured to remain in an open position when a second solid state switch of the plurality of solid state switches fails in a closed position.

15. The fail-safe link according to claim 14, wherein the first and second solid state switches are configured at their gates to be in an off or open configuration.

16. The fail-safe link according to claim 15, where the built-in test circuit is configured to supply a load to a solid state power controller and determine if a voltage is present across the failed second solid state switch.

17. The fail-safe link according to claim 14, wherein a second solid state switch of the plurality of solid state switches is configured to remain in an open position when a first solid state switch of the plurality of solid state switches fails in a closed position.

18. The fail-safe link according to claim 17, wherein the first solid state switch being configured at its gate to be in an on or closed configuration, and the second solid state switch being configured at its gate to be in an off or open configuration.

19. The fail-safe link according to claim 18, where the built-in test circuit is configured to supply a load to a solid state power controller and determine a voltage is present across the failed second solid state switch.

20. A method of operating a fail-safe link comprising:
- providing a plurality of solid state switches having one or more varying periphery sizes connected in series between a power source and a load;
- providing a built-in test circuit that senses a voltage between at least one solid state switch of the plurality of solid state switches;
- sending a signal to each gate of the plurality of solid state switches to be in an open state;
- applying a load to a solid state power controller by a built-in test circuit; and
- sensing if an overvoltage condition across a first solid state switch of the plurality of solid state switches of varying periphery sizes and one of opens or closes a second solid state switch of the plurality of solid state switches of varying periphery sizes in accordance with a measured voltage being present across the first solid state switch of the plurality of solid state switches to confirm that the first solid state switch of the plurality of solid states switches has failed in a closed state.

* * * * *